(12) United States Patent
Hasegawa et al.

(10) Patent No.: US 7,365,381 B2
(45) Date of Patent: Apr. 29, 2008

(54) OPTICAL SENSOR WITH IMPROVED PLANARIZATION

(75) Inventors: Akihiro Hasegawa, Hashima (JP); Yoji Nomura, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 25 days.

(21) Appl. No.: 11/600,771

(22) Filed: Nov. 17, 2006

(65) Prior Publication Data

US 2007/0120131 A1    May 31, 2007

(30) Foreign Application Priority Data

Nov. 25, 2005    (JP)    ............................ 2005-340349

(51) Int. Cl.
    *H01L 31/113*    (2006.01)
(52) U.S. Cl. ........................ 257/292; 257/290; 257/431
(58) Field of Classification Search ........ 257/290–294, 257/431–434, 443, 444, 458, 461, 464, 466, 257/E31.11, E31.113, E31.114, E31.115; 438/618–640

See application file for complete search history.

(56) References Cited

U.S. PATENT DOCUMENTS

| | | | | |
|---|---|---|---|---|
| 6,072,225 A | * | 6/2000 | Chang et al. | ............... 257/466 |
| 2004/0155320 A1 | * | 8/2004 | DeJule et al. | ............... 257/659 |

\* cited by examiner

*Primary Examiner*—Zandra V. Smith
*Assistant Examiner*—Paul E Patton
(74) *Attorney, Agent, or Firm*—Oliff & Berridge, PLC

(57) ABSTRACT

In a photodetector where a circuit section, in which an interconnection is formed, is formed adjacent to a light receiving section, photo sensitivity within a light receiving surface is prevented from being non-uniform due to an interlayer insulating film at a periphery of the light receiving section being increased in thickness. In a circuit region, a buffer region is disposed adjacent to a light receiving section. In the buffer region, in order to reduce irregularity of an interlayer insulating film, a density of planarizing pads disposed between the interconnections is gradually reduced from a standard value in a region as it approaches the light receiving section.

5 Claims, 6 Drawing Sheets

(related art)

(related art)

OPTICAL SENSOR WITH IMPROVED PLANARIZATION

CROSS-REFERENCE TO RELATED APPLICATION

The priority application Ser. No. JP2005-340349 upon which this patent application is based is hereby incorporated by the reference.

FIELD OF THE INVENTION

The present invention relates to a semiconductor device with a light receiving section and a circuit section which are disposed adjacent to each other on a common semiconductor substrate, and in particular, to improvements in uniformity of an interlayer insulating film which transmits light to the light receiving section.

BACKGROUND OF THE INVENTION

In recent years, optical disks, such as a CD (Compact Disk) and a DVD (Digital Versatile Disk), have become prominent as an information recording medium. A reproducing device for these optical disks emits a laser beam along a track of the optical disk by means of an optical pickup mechanism and detects the reflected light. Recorded data is then reproduced in accordance with a change of the reflected light intensity.

The optical disk reproducing device, while detecting the data based on the reflected light, servo-controls a positional relationship between the optical pickup mechanism and the optical disk. Specifically, it performs a tracking servo control for emitting the laser beam along with a centerline of the track and a focus servo control for keeping a distance between the optical disk and the optical pickup mechanism constant. For example, the focus servo control variably controls a position of the optical pickup mechanism with an actuator, based on an output signal from a photodetector for detecting the reflected laser beam, to thus keep a distance d between the optical pickup mechanism and the optical disk constant. As a result, a fluctuation in the amount of the reflected light in accordance with a focus offset of the emitted light on the surface of the optical disk is suppressed, and thus noise superimposed on a light receiving signal is suppressed.

In order to acquire information for such servo control, there is used a device as a photodetector for dividing a reflected light image into a plurality of segments to thereby receive them. FIGS. 1 to 3 are schematic diagrams illustrating light receiving sections of the photodetectors and the reflected light images on the light receiving sections. The reflected laser beam enters into the photodetector through a cylindrical lens. The reflected light has a circular cross section when entering into the cylindrical lens. Based on a principle of an astigmatism method, after passing through the cylindrical lens, a dimensional ratio of two directions orthogonal to each other in the reflected light image is changed, in accordance with the distance d between the optical pickup mechanism and the optical disk. Specifically, if the distance d is a target value, the reflected light image is set to be a perfect circle 10 as shown in FIG. 2. Meanwhile, if the distance d is above the target value for example, the reflected light image will be a vertically elongated ellipse 12 as shown in FIG. 1, while the reflected light image will be a horizontally elongated ellipse 14 as shown in FIG. 3 if the distance d is below the target value.

The photodetector has the light receiving section divided into four (2×2) segments 16, wherein each segment constitutes a light receiving element which produces the light receiving signal. The photodetector is arranged so that diagonal directions of a 2×2 square array of the light receiving element are coincident with axes of the vertically elongated ellipse 12 and the horizontally elongated ellipse 14, respectively. Arrangement in such a way allows for determination of a shape of each reflected light image based on a difference between the sum of the output signals from the two light receiving elements aligned along a diagonal line in the vertical direction and the sum of the output signals from the other two light receiving elements aligned along the diagonal line in the horizontal direction, in FIGS. 1 to 3. The shapes of the reflected light images can be used for controlling the distance d. The reflected light intensity in accordance with the data will be calculated from the total of the output signals from the four light receiving elements.

Since a data rate read from the optical disk is extremely high, the photodetector is constituted of a semiconductor device using a PIN photodiode with high response speed. A small photoelectric conversion signal generated in the light receiving section is amplified with an amplifier and outputted to a subsequent signal processing circuit. Here, an interconnection length between the light receiving section and the amplifier is made as short as possible from the viewpoint of preventing attenuation of the photoelectric conversion signal and superimposition of the noise. From the viewpoint above and the viewpoint of reduction in manufacturing cost of the photodetector, the light receiving section having a PIN photodiode structure, and the circuit section including the amplifier or the like are preferably formed on the same semiconductor chip.

FIG. 4 is a schematic sectional view of the photodetector with the light receiving section and the circuit section which are disposed adjacent to each other on the common semiconductor substrate. The PIN photodiode structure is formed in a region corresponding to a light receiving section 22 of a semiconductor substrate 20, while circuit elements such as a transistor or the like are formed in a region corresponding to a circuit section 24 thereof. An anode region and an i layer with high resistivity of the PIN photodiode are constituted of a p-type region (P-sub 26) of the semiconductor substrate 20 and an epitaxial layer 28 on a surface side of the semiconductor substrate 20, respectively. A cathode region of the PIN photodiode is constituted of an n⁺ region 30 which is formed by diffusing impurities on the surface of the i layer.

The photodetector shown in FIG. 4 has a structure in which two interconnection layers are formed on the semiconductor substrate 20. A first interlayer insulating film 40 is deposited on the surface of the semiconductor substrate 20, and an aluminum layer (a first Al layer) serving as a metal film is then deposited thereon. The first Al layer is patterned using a photolithography technique, and a first interconnection layer 42 and a planarizing pad 44 are formed in the circuit section 24 using this first Al layer. Here, the planarizing pad 44 is disposed in a region between the interconnections 42 to reduce irregularity on a surface of an interlayer insulating film 46 which is to be subsequently laminated thereon. A second Al layer is then deposited on the surface of the interlayer insulating film 46, and by patterning it, a second interconnection layer 48 and a planarizing pad 50 are formed in the circuit section 24. The planarizing pad 50 serves similarly to the planarizing pad 44. In other words, it is disposed in the region between the interconnections 48 to reduce irregularity on a surface of an interlayer insulating film 52 which is to be subsequently laminated thereon. As a result, by planarization of the interlayer insulating films using the planarizing pads, the heights of the interlayer insulating films 46 and 52 can be equalized over the circuit section 24. On the interlayer insulating film 52 in the circuit section 24, an Al layer 54 for light shielding is deposited, and a silicon oxide film 56 and a silicon nitride film 58, both serving as a protective film, are deposited sequentially.

Thereafter, in order to improve a light incidence efficiency to the semiconductor substrate in the light receiving section 22, an etch back process is performed to reduce a thickness of the layer stack on the semiconductor substrate in the light receiving section 22. In FIG. 4, dotted lines represent portions to be etched off among the respective layers stacked on the light receiving section 22. Namely, a silicon nitride film 58', a silicon oxide film 56', an interlayer insulating film 52', and an interlayer insulating film 46' are etched off, so that a protective layer 60 on the surface of the light receiving section 22 is formed of the remaining interlayer insulating film.

The interlayer insulating films 46 and 52 are formed by applying a material having fluidity, such as a SOG (Spin on Glass), using a spin-coat method or the like. Here, since the metal films which constitute the interconnection and the planarizing pads are disposed in the circuit section 24, a step is caused at the boundary between the light receiving section 22 and the circuit section 24 according to the presence/absence of the metal film. The applied material tends to be accumulated in a recess (internal corner) of the step. Consequently, the interlayer insulating film at a periphery of the light receiving section 22 will be thicker than that at a central portion of the light receiving section 22 before performing the etching process. Particularly, in the constitution described above where the metal films are left with relatively high area density in the circuit section 24 in order to reduce the irregularity of the interlayer insulating films, the surface of the interlayer insulating films remains high in the circuit section 24 because of the thickness of the metal films. Due to this, the thicknesses of the interlayer insulating films 46 and 52 increase at the periphery of the light receiving section 22, and an area where the interlayer insulating films are thick extends inward in the light receiving section 22. A profile of the surface of the interlayer insulating film 52 formed as described above is reflected to a profile of the protective film to be deposited thereon, and is further reflected to a profile of the protective layer 60 in the light receiving section 22 after the etching process. Consequently, an area at the periphery of the light receiving section 22 where the protective layer 60 is thick extends relatively inward in the light receiving section 22, similarly to the protective layers 46 and 52. Therefore, there has been a problem that the influence of attenuation of the incident light at the periphery of the light receiving section 22 and the influence of refraction of the incident light due to the protective layer surface being inclined at the periphery have increased, and thus the nonuniformity in photo sensitivity within a light receiving surface could be significant. Particularly, the more the amount of etch-off increases, the more a ratio between the thicknesses at the central portion and at the periphery of the protective layer 60 increases, so that there is a difference in attenuation between the incident light at the central portion and at the periphery of the light receiving section 22.

SUMMARY OF THE INVENTION

A semiconductor device according to the present invention includes a light receiving section and a circuit section which are disposed adjacent to each other on a common semiconductor substrate, including an interconnection of the circuit section formed by patterning a metal film laminated on the semiconductor substrate, an interlayer insulating film laminated on the circuit section and the light receiving section after forming the interconnection, and a planarizing pad, which is formed in a region between the interconnections prior to the lamination of the interlayer insulating film, and reduces irregularity on a surface of the interlayer insulating film in the circuit section, wherein the circuit section includes a buffer region adjacent to a boundary between the circuit section and the light receiving section, the buffer region having the planarizing pad arranged thereon so that an area occupation ratio of the interconnection and the planarizing pad on the buffer region is lower than the area occupation ratio thereof on the entire circuit section.

DESCRIPTION OF THE PREFERRED EMBODIMENTS

Hereinafter, embodiments of the present invention will be described with reference to the drawings.

Figure 5:
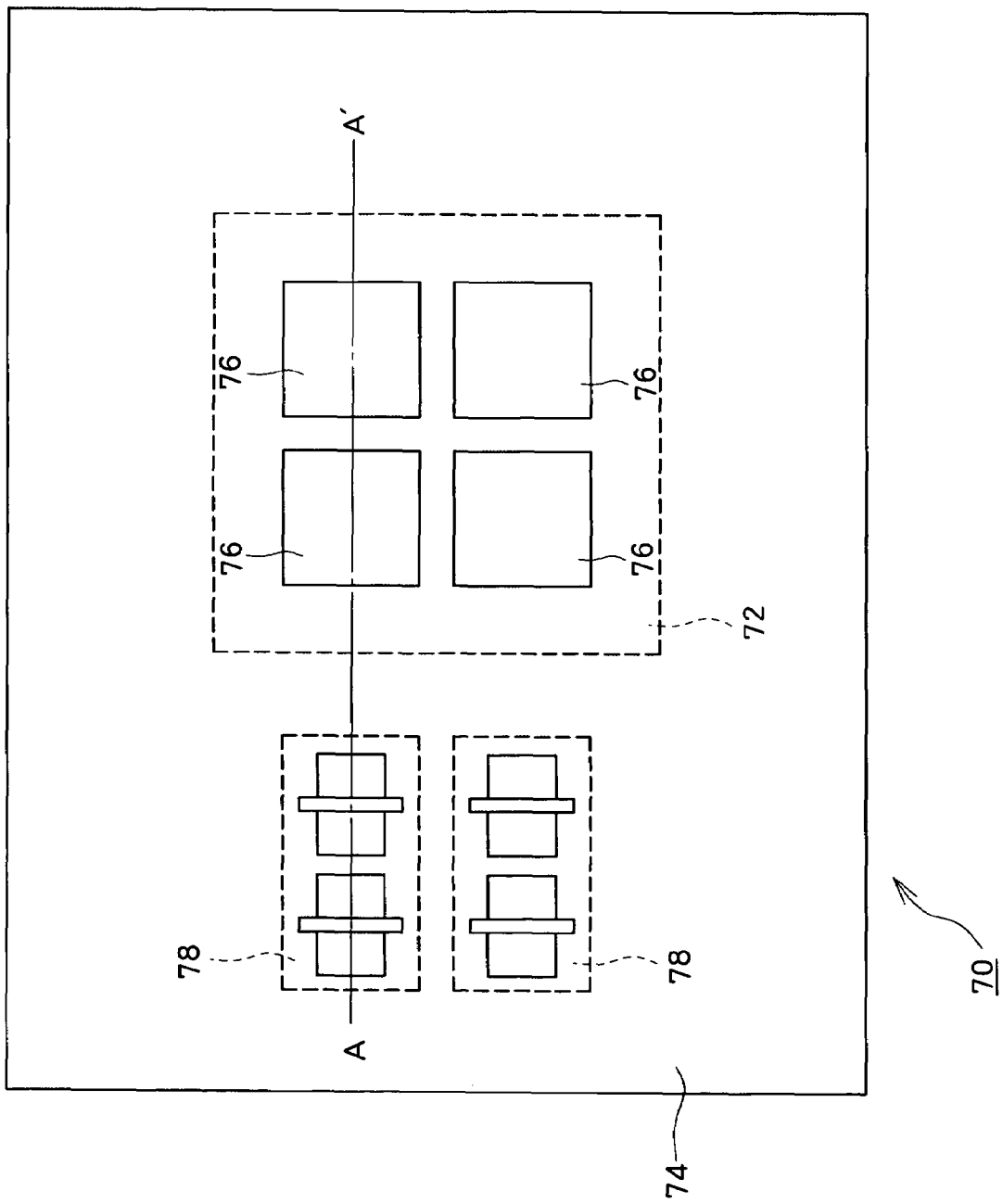
FIG. 5 is a schematic plan view of the photodetector of an embodiment of the present invention.

FIG. 5 is a schematic plan view of a photodetector which is a semiconductor device of an embodiment. A photodetector 70 is formed in a semiconductor substrate composed of silicon. The photodetector 70 is constituted of a light receiving section 72 and a circuit section 74. The light receiving section 72 includes four PIN photodiodes (PD) 76 arranged in, for example 2×2, and receives light entering into a substrate surface from an optical system while dividing the light into four segments. The circuit section 74 is disposed, for example around the light receiving section 72. A circuit element, for example a CMOS 78 or the like is formed in the circuit section 74. Using such circuit elements in the circuit section 74, an amplifier circuit for an output signal from the light receiving section 72 or other signal processing circuits can be formed in the same semiconductor chip integrally with the light receiving section 72. Although not shown in FIG. 5, there are disposed an interconnection connected to the circuit element, and an interconnection connected to a diffusion layer which constitutes the light receiving section 72 in the circuit section 74.

Figure 6:
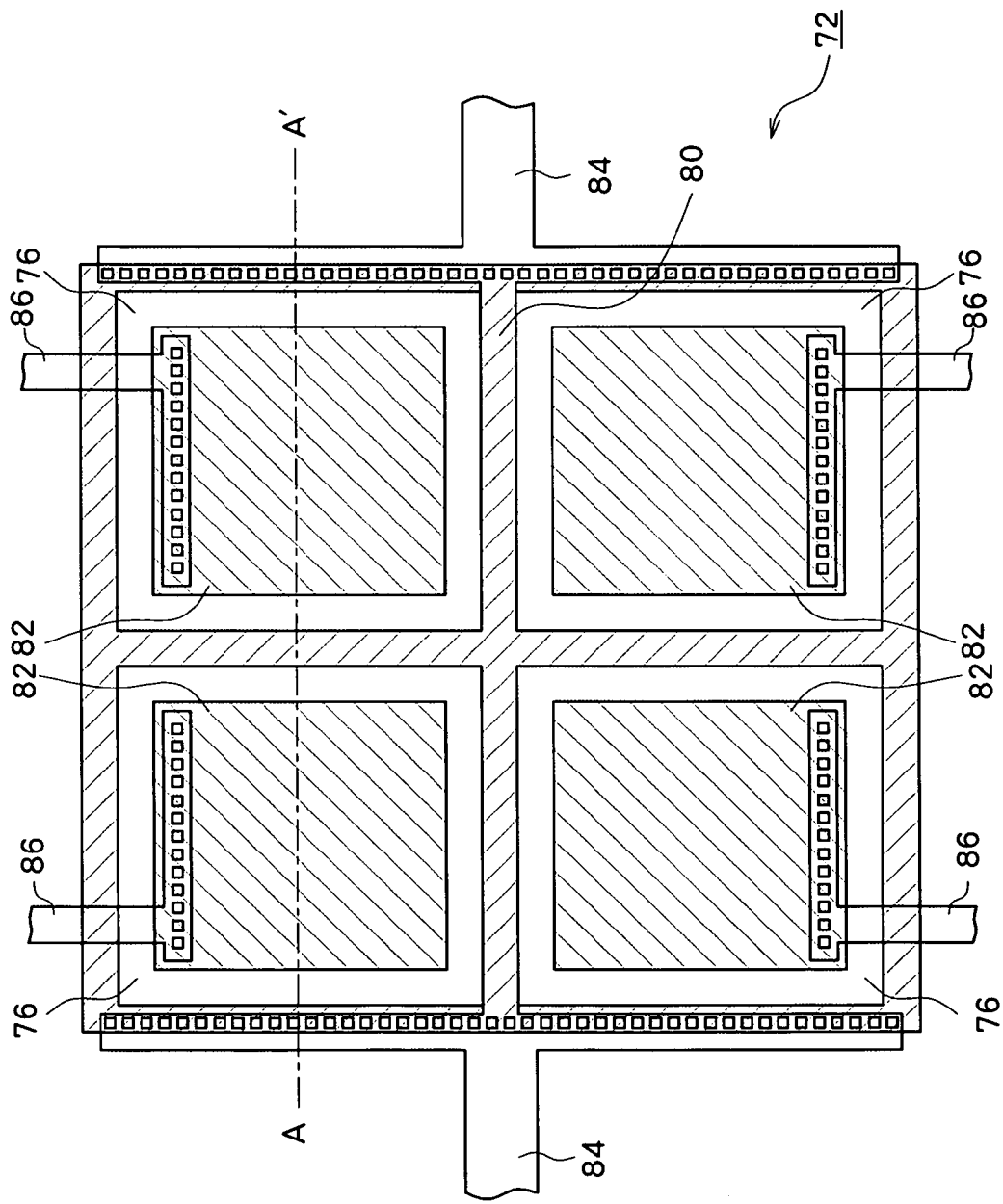
FIG. 6 is a more detailed plan view of an example of a light receiving section according to the embodiment of the present invention.

FIG. 6 is a more detailed plan view of an example of the light receiving section 72. The respective PDs 76 are separated from each other by a isolation region 80 formed on a surface of the semiconductor substrate around their periphery. For example, as the isolation region 80, a p$^+$ region into which p-type impurities are diffused at high concentration is formed. In a portion corresponding to the light receiving section of the silicon substrate, electrons and holes are generated by absorption of the light. A cathode region 82 for collecting the electrons among generated charges is disposed in each PD 76 as its cathode. As the cathode region 82, for example, an n$^+$ region into which n-type impurities are diffused at high concentration is formed.

The isolation region 80 and each cathode region 82 are respectively connected to the interconnection formed of, for example, Al layers via contacts. A ground potential, for example, is applied to the isolation region 80 via an interconnection 84 extending from the circuit section 74. Signal charges collected at each cathode region 82 are read out via an interconnection 86 by the signal processing circuit formed in the circuit section 74. For example, a current signal read out from the cathode region 82 is converted into a voltage signal by a current detector and then amplified by the amplifier circuit.

Figure 7:
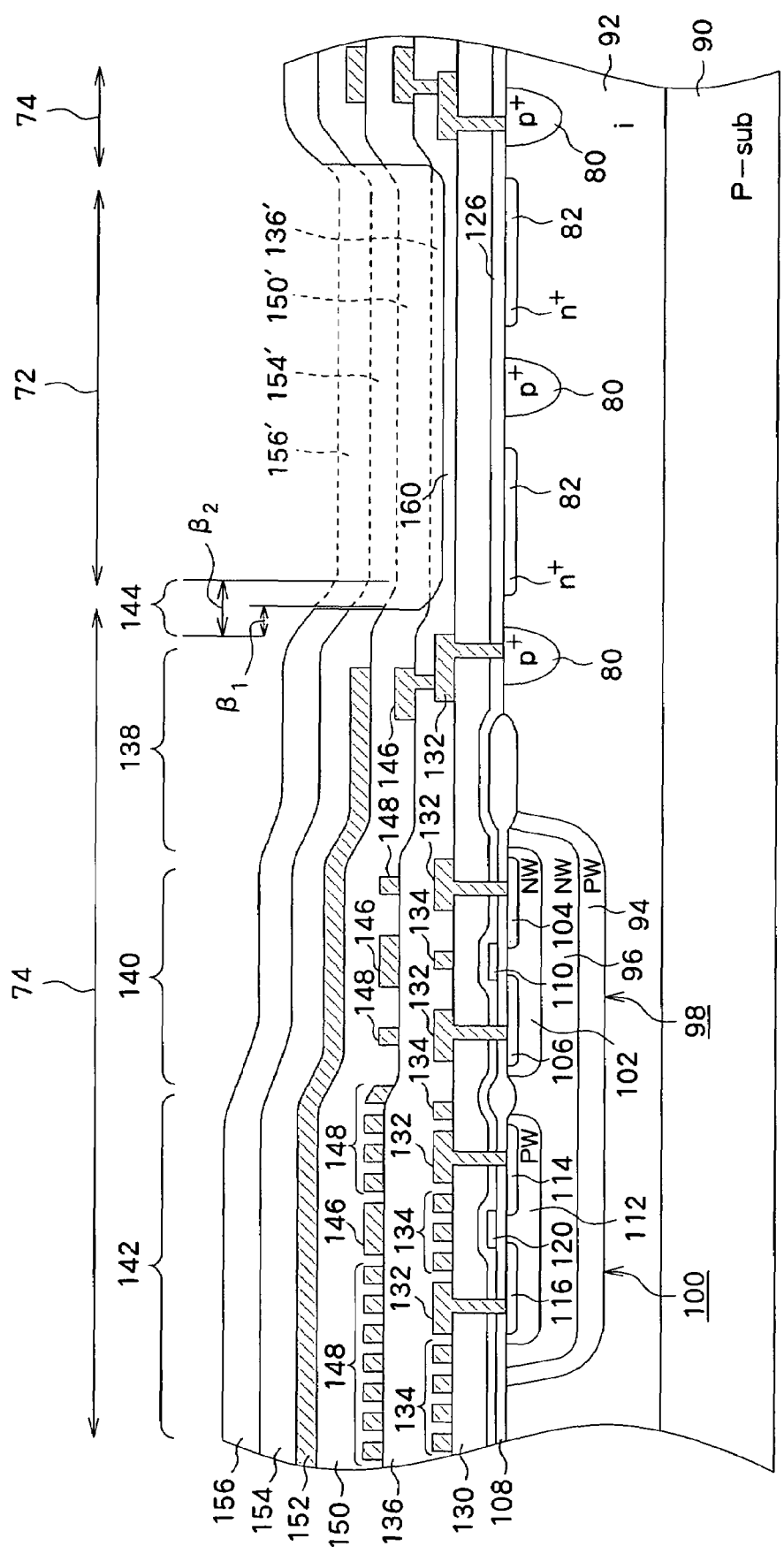
FIG. 7 is a schematic sectional view illustrating a structure of the light receiving section and the circuit section of the photodetector of the embodiment of the present invention.

FIG. 7 is a schematic sectional view illustrating a structure of the light receiving section 72 and the circuit section 74 taken at a cross section perpendicular to the semiconductor substrate along a line A-A' illustrated in FIGS. 5 and 6, respectively. The cross section represents a structure of the two PDs 76 in the light receiving section 72, the CMOS 78 in the circuit section 74, and the interconnections, an interlayer insulating film, or the like laminated on the semiconductor substrate in which the PDs and the CMOS are formed.

The photodetector 70 of this embodiment is formed using the semiconductor substrate which an epitaxial layer 92 is grown on the P-sub layer 90 which is a p-type silicon substrate. The epitaxial layer 92 has an impurity concentration lower than that of the P-sub layer 90 and a high resistivity. The P-sub layer 90 constitutes an anode common to respective PDs 76, to which the ground potential is applied from the rear side of the substrate, for example. As described above, the isolation region 80, to which the ground potential is applied via the interconnection 84 provided on a substrate surface side, constitutes the anode along with the P-sub layer 90.

In the light receiving section 72, the epitaxial layer 92 constitutes an i layer of the PD 76. The low concentration impurities to be introduced into the epitaxial layer 92 are, for example the p-type impurities. A thickness of the epitaxial layer 92 is determined to exceed the extent of an absorption length of the light to be detected within the semiconductor. For example, the absorption length of the silicon for the light of the 780 nm band or the 650 nm band, used for a CD or a DVD, is approximately 10 to 20 micrometers. Hence, the thickness of the epitaxial layer 92 will be determined to be 10 to 20 micrometers in this embodiment. In the light receiving section 72, the isolation region 80 and the cathode region 82 described above are formed in the surface of the epitaxial layer 92.

Meanwhile, in the circuit section 74, a P-well 94 and an N-well 96 are formed in a surface area of the epitaxial layer 92 corresponding to the region where the CMOS 78 is formed. Here, the N-well 96 is the region where the circuit element is formed therein, as will be described later. Meanwhile, the P-well 94 is a region for forming a boundary between the N-well 96 and the epitaxial layer 92, wherein the concentration thereof is set higher than that of the epitaxial layer 92 to thereby reduce a junction leakage current between the epitaxial layer 92 and the N-well 96.

In the N-well 96, a p-channel MOSFET 98 and an n-channel MOSFET 100 which constitute the CMOS 78 are formed. For example, an N-well 102 is further formed in the N-well 96, and thus the p-channel MOSFET 98 is formed in the N-well 102. A source region 104 and a drain region 106, both being the p$^+$ regions, of the MOSFET 98 are formed in the surface of the N-well 102. A gate electrode 110 is disposed over a channel region between the source region 104 and the drain region 106 via a gate oxide film 108. A P-well 112 is further formed in the N-well 96, and thus the n-channel MOSFET 100 is formed in the P-well 112. A source region 114 and a drain region 116, both being the n$^+$ regions, of the MOSFET 100, are formed in the surface of the P-well 112. A gate electrode 120 is disposed over the channel region between the source region 114 and the drain region 116 via the gate oxide film 108. The gate electrodes 110 and 120 are formed, for example, of polysilicon or tungsten (W).

As described above, after the circuit element structures such as the PD 76, the CMOS 78 or the like are formed on the surface of the semiconductor substrate, an interconnection structure and the structure such as the protective film are subsequently formed on the semiconductor substrate. For example, the gate electrodes 110 and 120 are formed, followed by forming an antireflection film 126. The antireflection film 126 is constituted of, for example a silicon nitride film. Subsequently, a first interlayer insulating film 130 is laminated thereon, and a first Al layer serving as the metal film is further deposited thereon.

The first Al layer is patterned using a photolithography technique and a first interconnection layer 132 and a planarizing pad 134 are then formed in the circuit section 74 using this first Al layer. Here, the planarizing pad 134 is disposed in a region between the interconnections 132 to reduce irregularity on a surface of an interlayer insulating film 136 to be subsequently laminated thereon.

Here, an area density (area occupation ratio) of the first Al layer left on the circuit section 74 will be represented by σ. In the photodetector 70 of this embodiment, a value of σ in a region adjacent to the light receiving section 72 (buffer region) is set to be lower than an average value of σ in the entire circuit section 74. In addition, the value of σ is gradually changed in accordance with a distance from the light receiving section 72 also in the buffer region adjacent to the light receiving section 72 in the circuit section 74. For example, the buffer region includes regions 138 and 140 adjacent to the light receiving section 72, wherein the average value of the σ for those is set to be lower than the average value of σ in a region 142 apart from the light receiving section 72. The average value of σ in the region 138 which is closer to the light receiving section 72 than the region 140 is set to be lower than the value in the region 140. This adjustment of σ is achieved by changing an arrangement density of the planarizing pad 134. For example, in FIG. 7, the planarizing pad 134 is not arranged in the region 138, while the planarizing pads 134 are more sparsely arranged in the region 140 than in the region 142. After forming the interconnection 132 and the planarizing pad 134 as described above, an SOG is spin coated to form the interlayer insulating film 136.

There is a tendency, in the region where the arrangement density σ of the Al layer is high, for the thickness of the interlayer insulating film on the Al layer to be thick and the height of the surface of the interlayer insulating film to be relatively high, while the thickness of the interlayer insulating film on the Al layer is thin and the height of the surface of the interlayer insulating film is relatively low in the region where σ is low. As a reason for this, it will be considered that the SOG is more likely to flow into a gap region as the gap region of an Al pattern such as the interconnection 132 and the planarizing pad 134 is larger, and thus the SOG is less likely to remain on the Al layer.

For that reason, the surface of the interlayer insulating film 136 is gradually reduced in height from the original height in the region 142, to the height in the region 140, and to the height in the region 138. By reducing the height of the interlayer insulating film 136 in the buffer region adjacent to the boundary with the light receiving section 72, accumulation of the SOG in a peripheral region 144 of the light receiving section 72 is reduced, so that the increase in thickness of the interlayer insulating film 136 in the peripheral region 144 is reduced. The thickness of the interlayer insulating film 136 in the peripheral region gradually decreases for a certain distance $β_1$, and then becomes balanced. This distance $β_1$ also decreases by reducing the height of the interlayer insulating film 136 in the buffer region adjacent to the boundary with the light receiving section 72.

After laminating the interlayer insulating film 136, a second Al layer is deposited thereon. The second Al layer is patterned using the photolithography technique, and a second interconnection layer 146 and a planarizing pad 148 are formed in the circuit section 74 using this second Al layer, as in the first Al layer. Here, the planarizing pad 148 is disposed in a region between the interconnection 146 to reduce irregularity on a surface of an interlayer insulating film 150 to be subsequently laminated thereon.

Also in the patterning of the second Al layer, the regions 138 and 140 adjacent to the light receiving section 72 in the circuit region 74 are formed as the buffer regions similar to the first Al layer. In addition, σ in relation to the second Al layer in the regions 138 and 140 is gradually changed in accordance with a distance from light receiving section 72, as in the first Al layer. By changing the arrangement density of the planarizing pad 148, the average value of σ in the buffer region is set smaller than the average value of σ in the region 142 apart from the light receiving section 72, while the average value of σ in the region 138 closer to the light receiving section 72 than the region 140 is set smaller than the value in the region 140. For example, in FIG. 7, the planarizing pad 148 is not arranged in the region 138, while the planarizing pads 148 is more sparsely arranged in the region 140 than in the region 142. After forming the interconnection 146 and the planarizing pad 148 as described above, the SOG is spin coated to form the interlayer insulating film 150.

For that reason, the height of the surface of the interlayer insulating film 150 is gradually reduced from the original height in the region 142, to the height in the region 140, and to the height in the region 138. By reducing the height of the interlayer insulating film 150 in the buffer region adjacent to the boundary with the light receiving section 72, accumulation of the SOG in the peripheral region 144 of the light receiving section 72 is reduced, and thus the increase in thickness of the interlayer insulating film 150 in the peripheral region 144 is reduced. A distance $β_2$ for the thickness of the interlayer insulating film 150 in the peripheral region to be balanced is also reduced.

On the interlayer insulating film 150 in the circuit section 74, an Al layer 152 for light shielding is deposited, and a silicon oxide film 154 and a silicon nitride film 156, both serving as a protective film, are deposited sequentially.

Thereafter, in order to improve a light incidence efficiency to the semiconductor substrate in the light receiving section 72, an etch back process is performed to reduce the thickness of the layer stack on the semiconductor substrate in the light receiving section 72. In FIG. 7, dotted lines represent portions to be etched off among the respective layers stacked on the light receiving section 72. Namely, a silicon nitride film 156', a silicon oxide film 154', an interlayer insulating film 150', and an interlayer insulating film 136' are etched off, so that a protective layer 160 is formed on the surface of the light receiving section 72 by the remaining interlayer insulating film.

Figure 1:
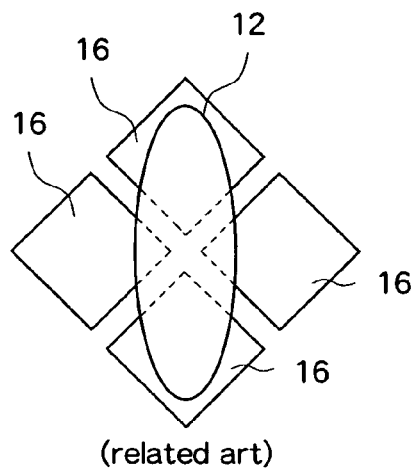
FIG. 1 is a schematic diagram illustrating a reflected light image on the light receiving section when a light receiving section of a photodetector and a disk are farther apart than a target distance.
Figure 2:
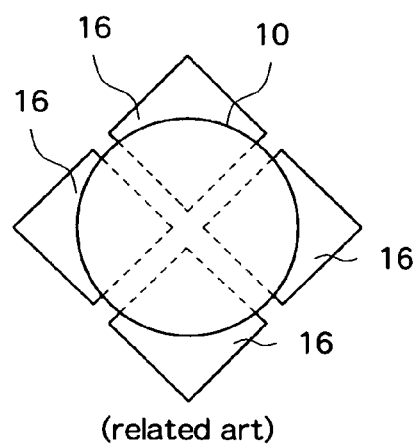
FIG. 2 is a schematic diagram illustrating the reflected light image on the light receiving section when the light receiving section of the photodetector and the disk are the target distance apart.
Figure 3:
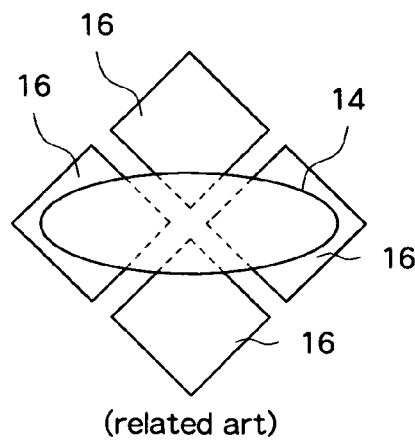
FIG. 3 is a schematic diagram illustrating the reflected light image on the light receiving section when the light receiving section of the photodetector and the disk are closer together than the target distance.
Figure 4:
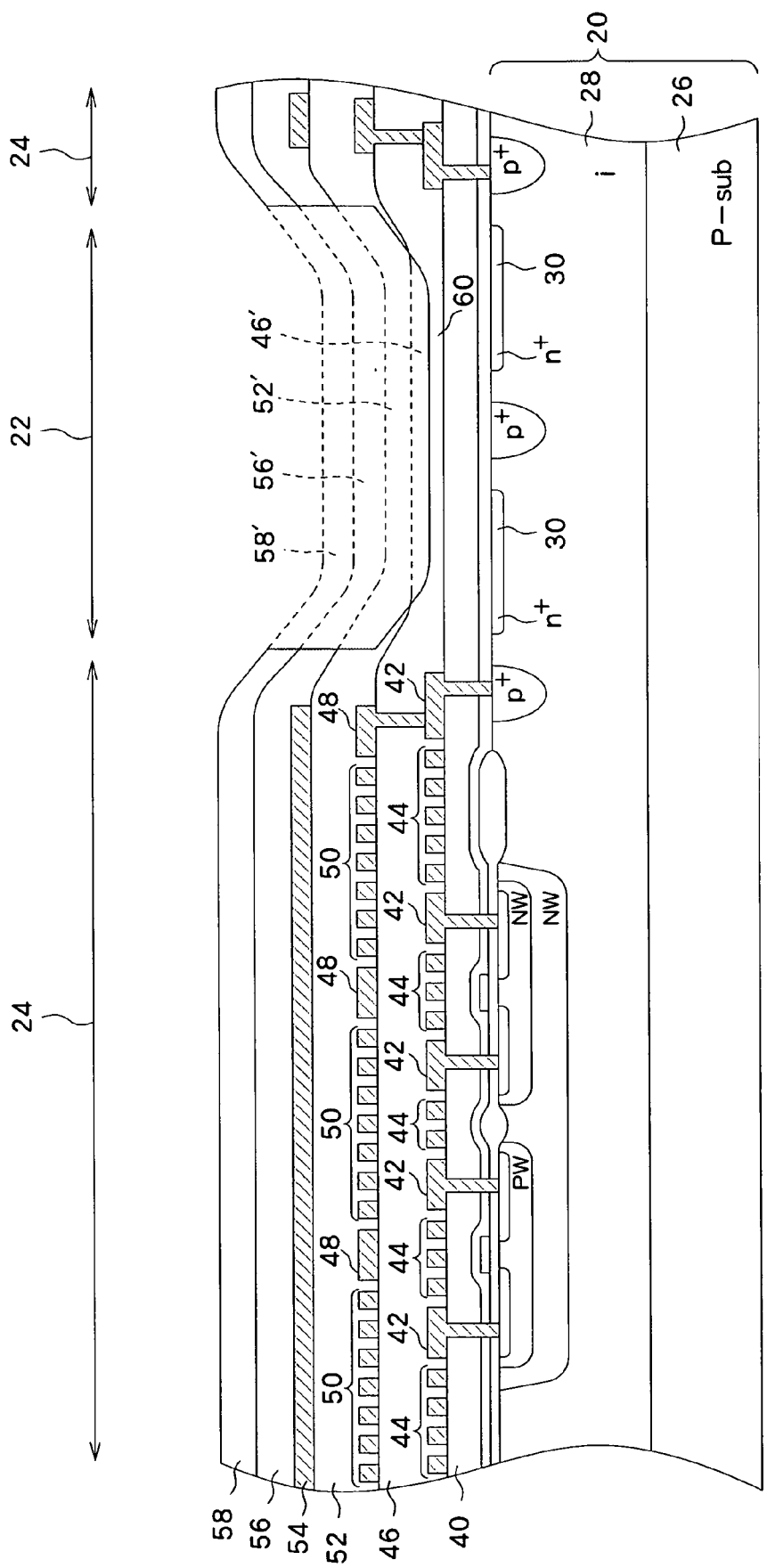
FIG. 4 is a schematic sectional view of the photodetector according to the conventional art where the light receiving section and a circuit section are disposed adjacent to each other on a common semiconductor substrate.
Figure 8:
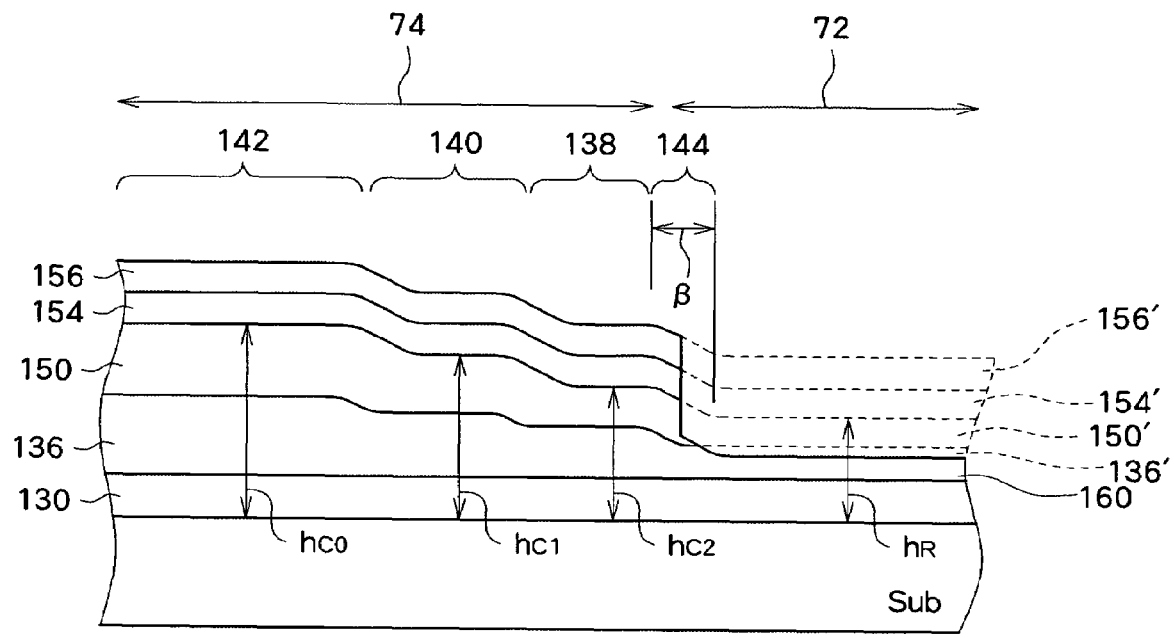
FIG. 8 is a schematic sectional view illustrating change in a thickness of an interlayer insulating film in the vicinity of a boundary between the light receiving section and the circuit section of the photodetector of the embodiment of the present invention.
Figure 9:
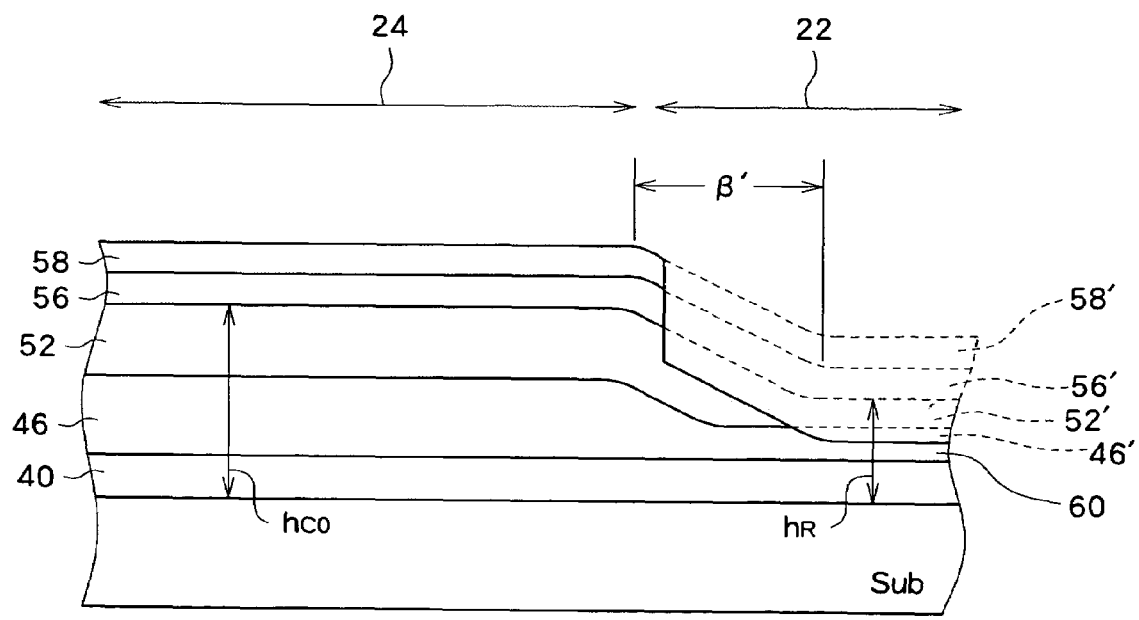
FIG. 9 is a schematic sectional view illustrating change in thickness of the interlayer insulating film in the vicinity of the boundary between the light receiving section and the circuit section of the photodetector according to the conventional art.

FIGS. 8 and 9 are schematic sectional views illustrating the change in thickness of the interlayer insulating film near the boundary between the light receiving section and the circuit section. FIG. 8 is the sectional view in relation to the photodetector 70 of this embodiment, where the sectional view in FIG. 7 is further simplified. FIG. 9 is a sectional view corresponding to the conventional photodetector shown in FIG. 4, which is shown for comparison with the detector 70 of this embodiment.

Reference characters $h_{C0}$, $h_{C1}$, $h_{C2}$, and $h_R$, shown in FIG. 8, represent the heights from the semiconductor substrate surface to the interlayer insulating film 150 surface, respectively. The reference character $h_{C0}$ represents the height in the region 142, which is a main portion in the circuit section 74 where the planarizing pads are arranged at high density. The reference character $h_{C1}$ represents the height in the region 140, which is the buffer region disposed in the circuit section 74 where the density of the planarizing pads is set low. The reference character $h_{C2}$ represents the height in the region 138, which is the buffer region disposed in the circuit section 74 where the planarizing pad is not arranged. The reference character $h_R$ represents the height in the central portion of the light receiving section 72.

In the photodetector 70 of this embodiment, the height from the semiconductor substrate surface to the interlayer insulating film 150 surface is set to be reduced gradually as it approaches the light receiving section 72. That is, the photodetector 70 of this embodiment is constituted so that $h_{C0}$, $h_{C1}$, $h_{C2}$, and $h_R$ satisfy following formula.

$$h_{C0} > h_{C1} > h_{C2} > h_R$$

In this constitution, corresponding to the difference between the height $h_R$ in the light receiving section 72 and the height $h_{C2}$ in the region 138 of the circuit section 74 adjacent to the light receiving section 72 decreasing, the distance $β$ ($=β_2$) at the peripheral region 144 of the light receiving section 72, which buffers the height difference ($h_{C2} - h_R$) by gradually changing the thickness of the interlayer insulating film, decreases as described above. A profile of the surface of the interlayer insulating film 150 formed as described above is reflected to a profile of the silicon oxide film 154 and the silicon nitride film 156 to be deposited thereon, and is further reflected to a profile of the protective layer 160 in the light receiving section 72 after the etching process. In other words, an area at the periphery of the light receiving section 72 where the protective layer 160 is thick decreases as the distance β of the peripheral region 144 is reduced. As a result, influence due to attenuation of the incident light or refraction of the incident light at the periphery of the light receiving section 72 is reduced, thus facilitating improved uniformity of photo sensitivity within a light receiving surface.

Moreover, in the photodetector 70 of this embodiment, the buffer region is divided into a plurality of zones, such as the regions 140 and 138, so as to gradually change the height of the interlayer insulating film. As a result, the change in height of the interlayer insulating film at the periphery of the circuit section 74 can be moderated, and the reduction in flatness of the surface of the interlayer insulating film in the peripheral region of the circuit section 74 can be relieved. By ensuring the flatness in the periphery region of the circuit section 74, formation of the Al film deposited on the interlayer insulating film in the periphery region and patterning of the Al film are performed well, thus making it possible to ensure quality of the interconnection.

Meanwhile, in the conventional composition shown in FIG. 9, high density arrangement of the planarizing pads at the periphery of the circuit section 24 allows the height $h_{C0}$ of the interlayer insulating film to be maintained over the entire circuit section 24. In this constitution, it is relatively easy to ensure the flatness of the interlayer insulating film in the circuit section 24. However, since the difference between the height $h_R$ in the light receiving section 22 and the height $h_{C0}$ in the circuit section 24 adjacent to the light receiving section 22 increases, a distance β' at the peripheral region of the light receiving section 22, which buffers the height difference ($h_{C0}-h_R$) by gradually changing the thickness of the interlayer insulating film, also increases. Therefore, there is a problem that it may be difficult to ensure the uniformity of the photo sensitivity within the light receiving surface, as described above.

Incidentally, in a spin coat process of the SOG, the SOG flows outwardly from the center in a radial direction of the semiconductor wafer. In accordance with an angular difference between the flowing direction of the SOG and the direction of the boundary between the light receiving section 72 and the circuit section 74, a difference may occur in accumulation of the SOG along a surface step at the boundary. For this reason, it may be considered that in the constitution where the circuit section 74 surrounds the light receiving section 72 as shown in FIG. 5, the thickness and the distance β of the interlayer insulating film in the periphery region 144 vary depending on a position at the periphery of the light receiving section 72, and thus the uniformity of the photo sensitivity within the light receiving surface is impaired. Particularly, in the case where the light receiving section 72 is constituted of a plurality of PDs 76, each of which is adjacent to a different portion of the periphery of the light receiving section 72, as shown in FIG. 5, the photo sensitivity of the respective PDs 76 may vary with respect to each other. In this point, however, the photo detector 70 of this embodiment reduces the range of fluctuation depending on the position of the periphery of the light receiving section 72 by reducing the step and the distance β in the peripheral region 144, so that good uniformity of the photo sensitivity within the light receiving surface can be achieved.

Note herein that while the buffer region is divided into the plurality of zones in the constitution described above, it may be constituted as a single region.

Moreover, in the embodiment described above, there has been shown the example where the difference of the area density of the planarizing pads between the region 142 and the buffer region, and among the respective zones of the buffer regions, has been achieved by changing the number of planarizing pads with a uniform size disposed per unit area. However, the difference of the area density of the planarizing pads can also be achieved by changing the size of the planarizing pad. In addition, the planarizing pad can be formed in various shapes, such as square, circular, and a strip elongated in a certain direction, for example. For example, it is possible to dispose a plurality of strip-shaped planarizing pads in parallel along the boundary between the light receiving section 72 and the circuit section 74, wherein a distribution of the area density can be achieved by adjusting widths of the respective strips or an array interval.

Although there has been described the example where the interlayer insulating film has been formed of the SOG in the constitution above, other materials, such as a BPSG (Borophosphosilicate Glass) and a TEOS (Tetra-ethoxy-silane), can be applied for the interlayer insulating film as long as it has transient fluidity upon lamination to reduce irregularity on the surface of the interlayer insulating film with the fluidity.

As described above, the semiconductor device according to the present invention includes the light receiving section and the circuit section which are disposed adjacent to each other on the common semiconductor substrate, including the interconnection of the circuit section formed by patterning a metal film laminated on the semiconductor substrate, the interlayer insulating film laminated on the circuit section and the light receiving section after forming the interconnection, and the planarizing pad, which is formed in a region between the interconnections prior to the lamination of the interlayer insulating film, and reduces irregularity on a surface of the interlayer insulating film in the circuit section. The circuit section includes the buffer region adjacent to the boundary between the circuit section and the light receiving section, the buffer region having the planarizing pad arranged thereon so that the area occupation ratio of the interconnection and the planarizing pad on the buffer region is lower than the area occupation ratio thereof on the entire circuit section.

According to the present invention, the area of the gap between the interconnection and the planarizing pad in the buffer region is set larger than the average value in the entire circuit section. In general, the interlayer insulating film has a function to reduce the irregularity in the region on which the film is laminated. Since the interlayer insulating film is laminated while filling the gap between the interconnection and the planarizing pad in the buffer region, the thickness directly above the interconnection and the planarizing pad becomes thinner than that of the region with the smaller gaps. Accordingly, the height of the surface of the interlayer insulating film in the buffer region becomes lower than the height of the entire circuit section by this extent, so that the height and its difference in the light receiving section is reduced. Thus, the increase in thickness of the interlayer insulating film in the peripheral region of the light receiving section adjacent to the circuit section is reduced, resulting in improvements in the uniformity of the interlayer insulating film in the entire light receiving section. In addition, in the constitution where the interlayer insulating film is etched back to form the protective layer in the light receiving section, the uniformity of the protective layer is improved.

The buffer region can be constituted of the plurality of zones in which the area occupation ratio increases as the distance from the boundary between the circuit section and the light receiving section increases.

The planarizing pad can be formed by patterning the metal film common to that used for the interconnection. As a result, the planarizing pad and the interconnection are formed simultaneously, thus achieving a simplification of the fabrication process.

The present invention is applied suitably to the case where the interlayer insulating film is composed of a material for smoothing its surface using fluidity possessed transiently after the lamination. The present invention is also applied suitably for the semiconductor device where the circuit section surrounds the light receiving section.

According to the present invention described above, the increase in the thickness of the interlayer insulating film at the periphery of the light receiving section is reduced, resulting in improvement in uniformity of the photo sensitivity in the light receiving section.

What is claimed is:

1. A semiconductor device with a light receiving section and a circuit section which are disposed adjacent to each other on a common semiconductor substrate, comprising:
   an interconnection of the circuit section formed by patterning a metal film laminated on the semiconductor substrate;
   an interlayer insulating film laminated on the circuit section and the light receiving section after forming the interconnection; and
   a planarizing pad which is formed in a region between the interconnections prior to laminating the interlayer insulating film, and reduces irregularity on a surface of the interlayer insulating film in the circuit section,
   wherein the circuit section includes a buffer region adjacent to a boundary between the circuit section and the light receiving section, the buffer region having the planarizing pad arranged thereon so that an area occupation ratio of the interconnection and the planarizing pad on the buffer region is lower than an area occupation ratio thereof on the entire circuit section.

2. The semiconductor device according to claim 1, wherein the buffer region is comprised of a plurality of zones in which the area occupation ratio increases, as a distance from the boundary between the circuit section and the light receiving section increases.

3. The semiconductor device according to claim 1, wherein the planarizing pad is formed by patterning the metal film common to that used for the interconnection.

4. The semiconductor device according to claim 1, wherein the interlayer insulating film is composed of a material for smoothing its surface using fluidity possessed transiently after the lamination.

5. The semiconductor device according to claim 1, wherein the circuit section is disposed so as to surround the light receiving section.

* * * * *